(12) United States Patent
Liu et al.

(10) Patent No.: US 7,498,653 B2
(45) Date of Patent: Mar. 3, 2009

(54) SEMICONDUCTOR STRUCTURE FOR ISOLATING INTEGRATED CIRCUITS OF VARIOUS OPERATING VOLTAGES

(75) Inventors: Chia-Wei Liu, Huatan Township, Changhua County (TW); Jun Xiu Liu, Taichung (TW); Chi-Hsuen Chang, Hsinchu (TW); Tzu-Chiang Sung, Jhubei (TW); Chung-I Chen, Hsinchu (TW); Rann-Shyan Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/273,228

(22) Filed: Nov. 12, 2005

(65) Prior Publication Data

US 2007/0235831 A1   Oct. 11, 2007

Related U.S. Application Data

(60) Provisional application No. 60/627,488, filed on Nov. 12, 2004.

(51) Int. Cl.
*H01L 29/00* (2006.01)

(52) U.S. Cl. .................... 257/500; 257/509
(58) Field of Classification Search ................ 257/500, 257/509
See application file for complete search history.

(56) References Cited

U.S. PATENT DOCUMENTS 6,055,655 A * 4/2000 Momohara ............ 714/723

* cited by examiner

*Primary Examiner*—Phat X Cao
(74) *Attorney, Agent, or Firm*—K & L Gates LLP

(57) ABSTRACT

A semiconductor structure for isolating a first circuit and a second circuit of various operating voltages includes a first isolation ring surrounding the first and second circuits on a semiconductor substrate. A buried layer continuously extending underneath the first and second circuits is formed on the semiconductor substrate, wherein the buried layer interfaces with the first isolation ring for isolating the first and second circuits from a backside bias of the semiconductor substrate. An ion enhanced isolation layer is interposed between the buried layer and well regions on which devices of the first and second circuits are formed, wherein the ion enhanced isolation layer is doped with impurities of a polarity type different from that of the buried layer.

18 Claims, 4 Drawing Sheets

SEMICONDUCTOR STRUCTURE FOR ISOLATING INTEGRATED CIRCUITS OF VARIOUS OPERATING VOLTAGES

RELATED APPLICATION

This application is related to and claims priority of U.S. Provisional Application Ser. No. 60/627,488 filed Nov. 12, 2004 entitled "STRUCTURE HAVING DIFFERENT POTENTIAL DEVICES IN THE SAME ISOLATION PACKAGE," the contents of which are hereby incorporated by reference.

BACKGROUND

The present invention relates generally to integrated circuit designs, and more particularly to structures and methods for placing devices of various operating voltages in the same isolation package.

In systems on chips (SoC), such as a semiconductor integrated circuit (IC) chip for a liquid crystal display (LCD) driver, isolation between circuit regions that operate at different voltages is necessary. Different regions of an IC can operate at two or more different voltages. The operating voltage of one device can have effects on its neighboring devices that operate at a different voltage. The voltage applied to the body of a metal-oxide-semiconductor (MOS) transistor can influence its threshold voltage $V_T$. As the voltage on the body, which is primarily set on the backside of a semiconductor chip, changes, the density of electrons in the inversion layer beneath the gate also changes. This, in turn, may cause a shift of the threshold voltage $V_T$.

There are other subtle influences that may cause a change of the threshold voltage $V_T$. An example is the effect of lateral currents within an IC chip. Current can escape from devices that are not thoroughly isolated from the rest of the chip. This current may travel laterally in the substrate of the chip and induce a voltage drop at various lateral points. Therefore, although the backside of a chip is likely metallized, its voltage may not be the same at all lateral points within the lower substrate beneath the devices. This makes isolation for circuits of various operating voltages difficult. The circuits of various operating voltages cannot be placed on the same semiconductor chip unless they are properly isolated from the influence of the backside bias. Without proper isolation, there may be punch through between devices as depletion regions of the devices that operate at different voltages expand toward each other.

While an isolation structure may eliminate or reduce some of the problems discussed above, the structure typically occupies a significant amount of surface area on an IC chip. As such, desirable in the art of semiconductor designs are compact isolation structures that can properly isolate the circuits operating at different voltages from the influence of the backside bias.

SUMMARY

The present invention provides a semiconductor structure for isolating a first circuit and a second circuit, which operate at different voltage levels. In one embodiment, the semiconductor structure includes a first isolation ring surrounding the first and second circuits on a semiconductor substrate. A buried layer continuously extending underneath the first and second circuits is formed on the semiconductor substrate, wherein the buried layer interfaces with the first isolation ring for isolating the first and second circuits from a backside bias of the semiconductor substrate. An ion enhanced isolation layer is interposed between the buried layer and well regions on which devices of the first and second circuits are formed. The ion enhanced isolation layer is doped with impurities of a polarity type different from that of the buried layer.

The construction and method of operation of the invention, however, together with additional objects and advantages thereof will be best understood from the following description of specific embodiments when read in connection with the accompanying drawings.

DESCRIPTION

Figure 1:
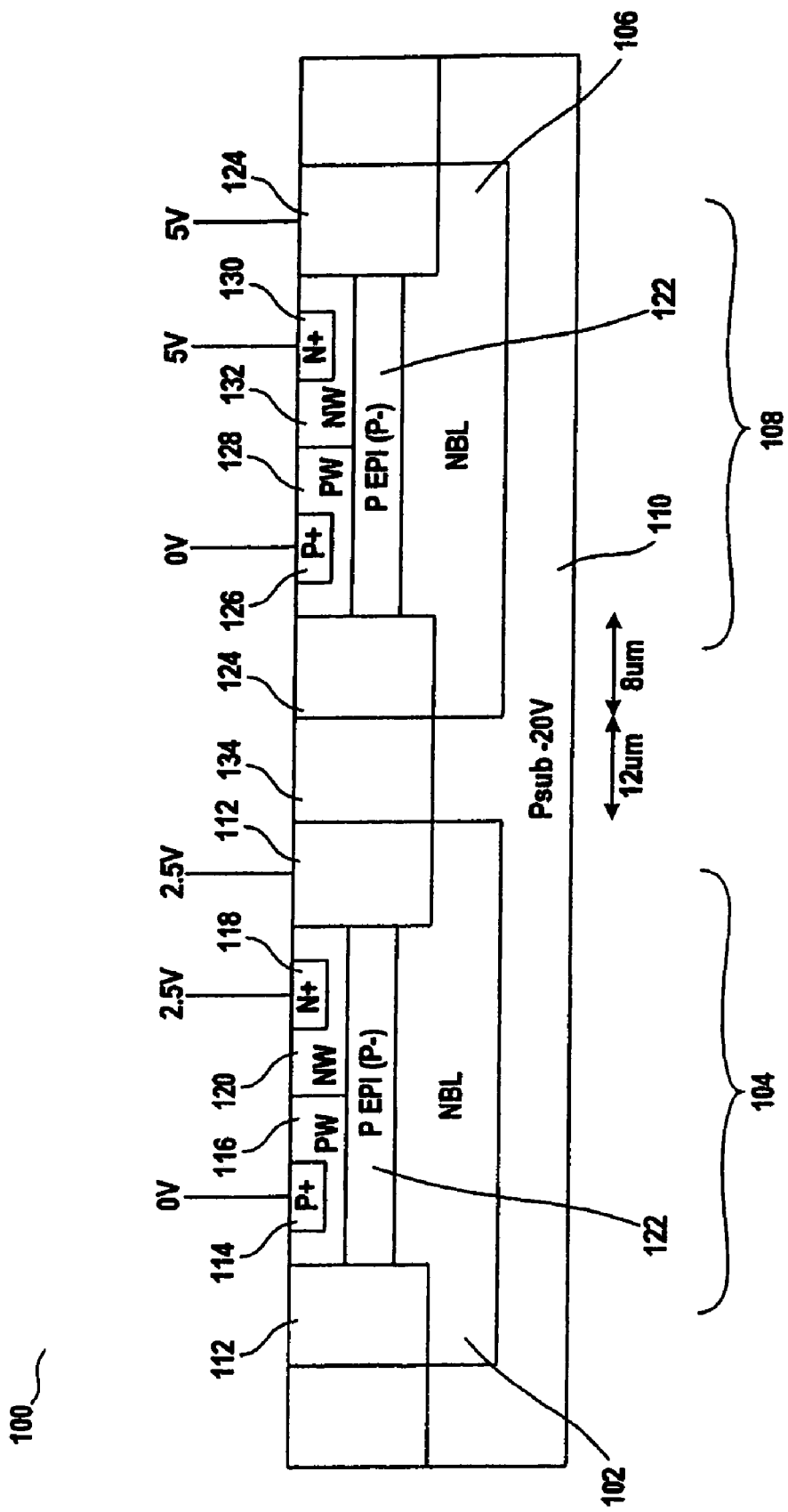
FIG. 1 illustrates a conventional isolation structure where separate isolation rings are implemented for isolating circuits of various operating voltages.

FIG. 1 illustrates a cross section of a conventional isolation structure 100 where separate isolation rings are implemented for isolating circuits of various operating voltages. The isolation structure is necessary since the operating voltage of one device may influence its neighboring devices that operate at a different voltage. In an IC chip, its backside is typically connected to a bias, which can influence the threshold voltage $V_T$ of a MOS transistor. Therefore, circuits of various operating voltages cannot be placed on the same semiconductor chip unless they are properly isolated from the influence of the backside bias.

An N-type buried layer 102, in a low voltage circuit 104, and another N-type buried layer 106, in a medium voltage circuit 108, are constructed on a P-type semiconductor substrate 110. An N-type isolation ring 112 interfaces with the N-type buried layer 102, thereby producing an N-type isolation cup for low voltage circuit elements such as an NMOS transistor that is placed with a P+ well contact 114 in a P-type well 116 and a PMOS transistor that is placed with an N+ well contact 118 in an N-type well 120. A lightly doped P-type epitaxial (epi) layer 122 is interposed between the wells 116, 120 and the N-type buried layer 102. An N-type isolation ring 124 interfaces with the N-type buried layer 106, thereby producing an N-type isolation cup for medium voltage circuit elements such as an NMOS transistor that is placed with a P+ well contact 126 in a P-type well 128 and a PMOS transistor that will be placed with an N+ well contact 130 in an N-type well 132. A lightly doped P-type epi layer 122 is interposed between the wells 128 and 132 and the N-type buried layer 106.

The low voltage circuit 104 and the medium voltage circuit 108 are separated and surrounded by a P-type isolation ring 134 that interfaces with the P-type substrate 110 that is common to the entire integrated circuit (IC) chip. The P-type isolation ring 134, and the N-type isolation rings 112 and 124 isolate one circuit from another. A 2.5-volt bias between the N-type isolation ring 112 and the backside of the IC is applied across the junction between the N-type buried layer 102 and the P-type substrate 110, and, by extension, across the junction between the N-type isolation ring 112 and the P-type isolation ring 134. Similarly, a 5-volt bias between the N-type isolation ring 124 and the backside of the IC is applied across the junction between the N-type buried layer 106 and the P-type substrate 110. These reverse-biased junctions are at some distance from MOS transistors on wells 116 and 120 in the low voltage circuit 104, and the MOS transistors on the wells 128 and 132 in the medium voltage circuit 108. Therefore, the threshold voltage shifting caused by the backside bias can be prevented.

One drawback of the conventional isolation structure is that the separation structure occupies a great deal of surface area. As shown in the figure, the P-type isolation ring 134 typically has a width of 12 um while each section of the N-type isolation rings 112 and 124 typically has a width of 8 um. The low voltage circuit 104 and the medium voltage circuit 108 are separated form one another around a 28 um distance.

Figure 2:
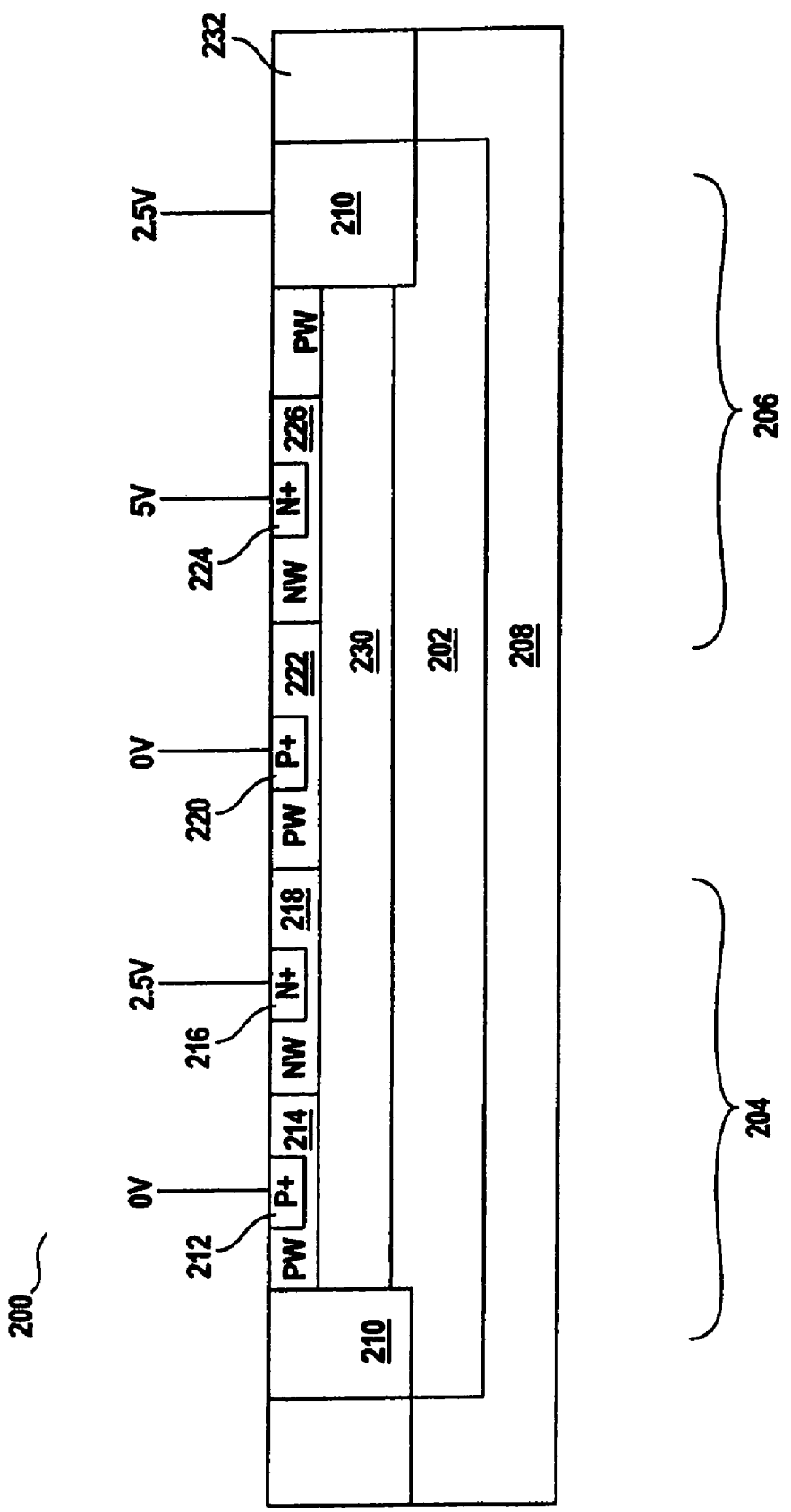
FIG. 2 illustrates an isolation structure, in which circuits of various operating voltages are placed in the same package, in accordance with one embodiment of the present invention.

FIG. 2 illustrates a cross-section of an isolation structure 200 for circuits of various operating voltages in accordance with one embodiment of the present invention. An N-type buried layer 202 continuously extends through a first circuit 204 and a second circuit 206, which operate at different voltages, in a P-type semiconductor substrate 208. An N-type isolation ring 210 interfaces with the N-type buried layer 202, thereby providing an N-type isolation cup for the circuit elements within the structure 200. For the first circuit 204, a P+ well contact 212 is placed in a P-type well 214 and an N+ well contact 216 is placed in an N-type well 218. For the second circuit 206, a P+ well contact 220 is placed in a P-type well 222 and an N+ well contact 224 is placed in an N-type well 226. The wells of the first and second circuits 204 and 206 are constructed on an ion enhanced isolation layer 230 that, in turn, is constructed on the N-type buried layer 202. A P-type isolation ring 232, which surrounds the N-type isolation ring 210, is constructed on the semiconductor substrate 208. In this embodiment, a 2.5 volt bias is provided between the N-type isolation ring 210 and the P-type isolation ring 232, and between the N-type buried layer 202 and the semiconductor substrate 208. This helps to isolate the wells 214, 218, 222 and 226 from a backside bias applied to the semiconductor substrate 208.

In this embodiment, the ion enhanced isolation layer 230 is a P-type epi layer. The ion enhanced isolation layer 230 is implanted or doped with P-type impurities for preventing punch-through between the first and second circuits 204 and 206 and the N-type buried layer 202. The impurity density of the ion enhanced isolation layer 230 is between about $1e^{15}$ $cm^{-3}$ and $1e^{18}$ $cm^{-3}$. The impurities of the ion enhanced isolation layer 230 can be implanted at an energy level between about 40 Kev and 150 Kev, which is much lower than certain high energy implant process which requires over 1000 Kev. The thickness of the ion enhanced isolation layer 230 is between about 1 um and 3 um. The ion enhanced isolation layer 230 prevents punch-through between the first and second circuits 204 and 206 and the N-type buried layer 202.

Furthermore, the ion enhanced isolation layer 230 and the P-type isolation ring 232 are implanted or doped with P-type impurities in the same process step. No mask additional to the mask for doping the P-type isolation layer 232 is needed for doping the ion enhanced isolation layer 230. As a result, the impurity density of the ion enhanced isolation layer 230 is substantially the same as that of the P-type isolation ring 232. As such, the ion enhanced isolation layer 230 can be formed without costs incurred by using additional masks.

The method for fabricating the structure 200 is described as follows. The N-type isolation ring 210 surrounding the first and second circuits 204 and 206 are formed on the semiconductor substrate 208. The N-type buried layer 202 continuously extending over the first and second circuits 204 and 206 are formed in the semiconductor substrate 208, wherein the N-type buried layer 202 interfaces with the N-type isolation ring 210 for isolating the first and second circuits 204 and 206 from a backside bias of the semiconductor substrate 280. The ion enhanced isolation layer 230 is formed between the N-type buried layer 202 and wells 214, 218, 222 and 226.

It is noted that while, in this embodiment, the isolation structure is constructed on a P-type semiconductor substrate, it can also be constructed on an N-type semiconductor substrate without departing from the spirit of the present invention. In such case, the ion enhanced isolation layer will be doped with impurities of a polarity type different from that of the buried layer for preventing punch through between the first and second circuits and the buried layer. The inner isolation ring, such as the isolation ring 210 as shown in FIG. 2, is doped with impurities of a polarity type different from that of the outer isolation ring, such as the isolation ring 232 as shown in FIG. 2. The buried isolation ring is doped with impurities of a polarity type the same as that of the inner isolation ring that interfaces with the same.

Figure 3A:
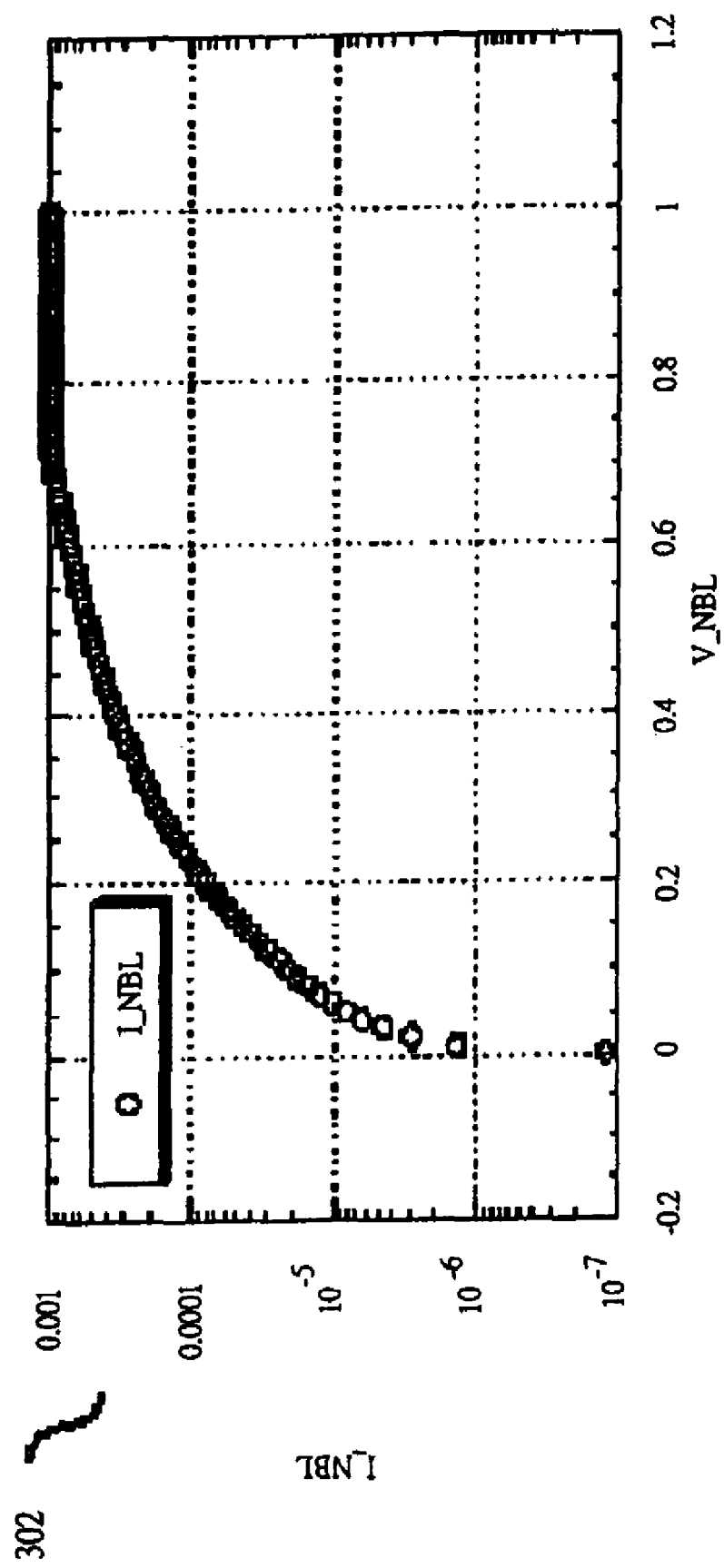
FIGS. 3A-3B illustrate two graphs comparing measurement data of the isolation structures as illustrated in FIGS. 1 and 2.
Figure 3B:
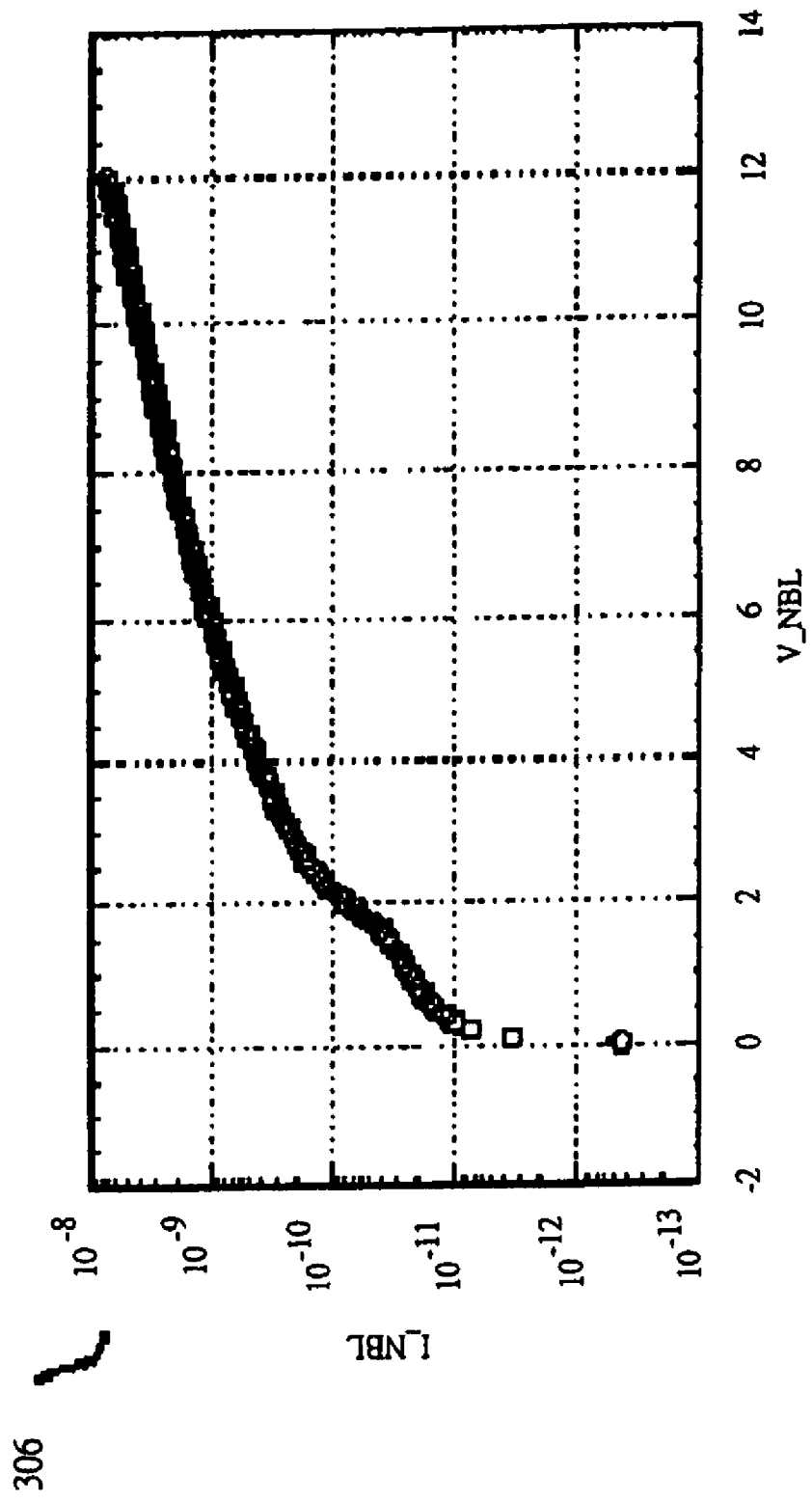

FIGS. 3A and 3B present two graphs 302 and 306 comparing the N-type buried layer (NBL) voltage with the N-type buried layer (NBL) current to determine if there is punch through occurs when a backside bias is applied to an IC chip. The graph 302 presents measurement data taken from the conventional structure 100 of FIG. 1. The graph 306 presents measurement data taken from the proposed structure 200 of FIG. 2. Referring to FIG. 3A, as the NBL voltage reaches about 0.7 volt, the NBL current detected is about 0.001 amp, which represents the resultant current induced by the punch through between various layers of the IC chip. Referring to FIG. 3B, as the NBL voltage reaches about 12 volt, the resultant NBL current detected is about $10^{-8}$ amp, which is negligible compared to the NBL current of the structure 100 as shown in FIG. 1. It is, therefore, understood that the proposed isolation structure prevents punch through between various layers.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure for isolating a first circuit operating at a first voltage level and a second circuit operating at a second voltage level, comprising:

an N-type isolation ring surrounding the first and second circuits on a semiconductor substrate;

a P-type isolation ring surrounding the N-type isolation ring, the P-type isolation ring having a P-type impurity density higher than that of the semiconductor substrate;

an N-type buried layer continuously extending underneath the first and second circuits on the semiconductor substrate, the N-type buried layer interfacing with the N-type isolation ring for isolating the first and second circuits from a backside bias of the semiconductor substrate;

a P-type ion enhanced isolation layer formed on the buried layer, the P-type ion enhanced isolation layer having a P-type impurity density substantially the same as that of the P-type isolation ring; and a set of N-type wells and P-type wells formed on the P-type ion enhanced isolation layer, wherein devices of the first and second circuits are formed on the set of N-type wells and P-type wells.

2. The semiconductor structure of claim 1 wherein the semiconductor substrate is a P-type substrate.

3. The semiconductor structure of claim 1 wherein the P-type ion enhanced isolation layer is an epitaxial silicon layer.

4. The semiconductor structure of claim 1 wherein the P-type ion enhanced isolation layer is implanted with P-type impurities for preventing punch-through between the first and second circuits.

5. The semiconductor structure of claim 1 wherein the impurity density of the P-type ion enhanced isolation layer is between about $1e^{15} cm^{-3}$ and $1e^{18} cm^{-3}$.

6. The semiconductor structure of claim 1 wherein the P-type ion enhanced isolation layer has a thickness between about 1 um and 3 um.

7. The semiconductor structure of claim 1 wherein the N-type buried layer has the same N-type impurity density as that of the N-type isolation ring.

8. The semiconductor structure of claim 1 wherein the N-type isolation ring is connected to a positive voltage.

9. A semiconductor structure for isolating a first circuit operating at a first voltage level and a second circuit operating at a second voltage level, comprising:

a first isolation ring surrounding the first and second circuits formed over a semiconductor substrate;

a second isolation ring surrounding the first isolation ring, wherein the second isolation ring is doped with impurity ions of a polarity type different from that of the first isolation ring, and has a higher impurity density than that of the semiconductor substrate;

a buried layer continuously extending underneath the first and second circuits, wherein the buried layer interfaces with the first isolation ring for isolating the first and second circuits from a backside bias of the semiconductor substrate; and an ion enhanced isolation layer interposed between the buried layer and well regions on which devices of the first and second circuits are formed, wherein the ion enhanced isolation layer has an impurity density substantially the same as that of the second isolation ring.

10. The semiconductor structure of claim 8 wherein the semiconductor substrate is a P-type substrate.

11. The semiconductor structure of claim 8 wherein the semiconductor substrate is an N-type substrate.

12. The semiconductor structure of claim 8 wherein the ion enhanced isolation layer is an epitaxial silicon layer.

13. The semiconductor structure of claim 8 wherein the ion enhanced isolation layer is implanted with P-type impurity ions for preventing punch-through between the first and second circuits.

14. The semiconductor structure of claim 8 wherein the ion enhanced isolation layer is implanted with N-type impurity ions for preventing punch-through between the first and second circuits.

15. The semiconductor structure of claim 8 wherein the impurity density of the ion enhanced isolation layer is between about $1e^{15} cm^{-3}$ and $1e^{18} cm^{-3}$.

16. The semiconductor structure of claim 8 wherein the ion enhanced isolation layer has a thickness between about 1 um and 3 um.

17. The semiconductor structure of claim 8 wherein the buried layer has an impurity density substantially same as that of the first isolation ring.

18. The semiconductor structure of claim 8 wherein the first isolation ring is connected to a positive voltage.

* * * * *